(12) United States Patent
Cai et al.

(10) Patent No.: US 12,471,254 B2
(45) Date of Patent: Nov. 11, 2025

(54) HEAT DISSIPATION COMPONENT AND ASSOCIATED ELECTRICAL DEVICE

(71) Applicant: Nokia Solutions and Networks Oy, Espoo (FI)

(72) Inventors: Hua Cai, Jiangsu (CN); Yan Xia, Jiangsu (CN)

(73) Assignee: Nokia Solutions and Networks Oy, Espoo (FI)

( * ) Notice: Subject to any disclaimer, the term of this patent is extended or adjusted under 35 U.S.C. 154(b) by 148 days.

(21) Appl. No.: 18/555,078

(22) PCT Filed: Apr. 14, 2021

(86) PCT No.: PCT/CN2021/087292
§ 371 (c)(1),
(2) Date: Oct. 12, 2023

(87) PCT Pub. No.: WO2022/217508
PCT Pub. Date: Oct. 20, 2022

(65) Prior Publication Data
US 2024/0206129 A1    Jun. 20, 2024

(51) Int. Cl.
*H05K 7/20* (2006.01)
*G02B 6/42* (2006.01)
*H04B 10/40* (2013.01)

(52) U.S. Cl.
CPC ......... *H05K 7/2049* (2013.01); *G02B 6/4269* (2013.01); *H05K 7/20336* (2013.01); *H05K 7/20418* (2013.01); *H04B 10/40* (2013.01)

(58) Field of Classification Search
CPC .... G02B 6/4269; G02B 6/428; G02B 6/4261; G02B 6/3628; G02B 6/4268;
(Continued)

(56) References Cited

U.S. PATENT DOCUMENTS 11,678,466 B2 * 6/2023 Gupta .................. H01R 13/516
361/709
11,789,220 B1 * 10/2023 Nguyen ............... G02B 6/4246
385/92

(Continued)

FOREIGN PATENT DOCUMENTS

| CN | 203279430 U | 11/2013 |
| CN | 104125751 A | 10/2014 |

OTHER PUBLICATIONS

International Search Report for International application No. PCT/CN2021/087292 dated Dec. 12, 2021.
(Continued)

*Primary Examiner* — Michael A Matey
(74) *Attorney, Agent, or Firm* — Harness, Dickey & Pierce, P.L.C.

(57) ABSTRACT

The heat dissipation component includes a heat conductor attached to the pluggable module or a heat sink associated with an interface of an electrical device and configured to conduct heat from the pluggable module to a heat sink, the heat conductor including the heat input section configured to be in thermal contact with the pluggable module; and a heat output section configured to be in thermal contact with the heat sink; and an elastic assembly coupled to the heat conductor and configured to, at least when the pluggable
(Continued)

module is coupled to the interface, apply biasing forces to press the heat input section to the pluggable module and to press the heat output section to the heat sink.

15 Claims, 7 Drawing Sheets

(58) Field of Classification Search
CPC .... G02B 6/4278; G02B 6/4284; G02B 6/426; H05K 7/20418; H05K 7/2039; H05K 7/20409; H05K 7/20445; H05K 9/0058; H05K 1/18; H05K 2201/06; H05K 2201/066; H05K 2201/10121; H05K 2201/10962; H05K 5/0286; H05K 3/301; H05K 7/20; H05K 7/20336; H05K 7/20436; H05K 7/205; H05K 5/0247; H05K 7/1427; H05K 7/20509; H05K 7/20854; H01R 12/722; H01R 13/6594; H01R 12/716; H01R 24/60; H01R 25/006; H01R 12/585; H01R 12/7064; H01R 13/2457; H01R 12/72; H01R 13/508; H01R 13/516; H01R 13/629; H01R 13/6581; H01R 13/6582; H01R 13/6591; G06F 1/20; H01L 23/367; H01L 23/40; H01L 23/42; H01L 23/4093; H04B 1/38; H04B 1/036; H04B 10/40
See application file for complete search history.

(56) References Cited

U.S. PATENT DOCUMENTS

| | | | | |
|---|---|---|---|---|
| 11,852,879 | B2* | 12/2023 | Kung | G02B 6/4277 |
| 2009/0296351 | A1 | 12/2009 | Oki et al. | |
| 2014/0160679 | A1* | 6/2014 | Kelty | G02B 6/4269 |
| | | | | 361/700 |
| 2014/0321061 | A1* | 10/2014 | Moore | B32B 27/281 |
| | | | | 361/709 |
| 2016/0093996 | A1* | 3/2016 | Phillips | H01R 24/60 |
| | | | | 439/487 |
| 2019/0379417 | A1 | 12/2019 | English et al. | |
| 2020/0022283 | A1 | 1/2020 | Han et al. | |
| 2021/0103108 | A1* | 4/2021 | Wall, Jr. | G02B 6/4261 |
| 2021/0247577 | A1* | 8/2021 | Hsiao | H05K 7/2039 |
| 2021/0325616 | A1* | 10/2021 | Lands | G02B 6/4269 |
| 2022/0252800 | A1* | 8/2022 | Myhre | H04B 1/036 |
| 2023/0389232 | A1* | 11/2023 | Ahamed | G02B 6/4269 |
| 2025/0107028 | A1* | 3/2025 | Mosti | H05K 7/1452 |

OTHER PUBLICATIONS

Search Report for European Application No. 21936400.7 dated Dec. 4, 2024.

* cited by examiner

HEAT DISSIPATION COMPONENT AND ASSOCIATED ELECTRICAL DEVICE

CROSS-REFERENCE TO RELATED APPLICATIONS

This application is a national phase under 35 U.S.C. § 371 of PCT International Application No. PCT/CN2021/087292 which has an International filing date of Apr. 14, 2021, the entire contents of each of which are hereby incorporated by reference.

FIELD

Example embodiments of the present disclosure generally relate to the field of telecommunication and in particular, to a heat dissipation component for a pluggable module.

BACKGROUND

A new standard for telecommunications, 5G, has been designed to provide faster data transmission speeds than LTE (4G) systems, approaching broadband speeds achieved with landlines. Faster data communications will present challenges for critical components of telecommunication networks such as optical transceivers. Optical transceivers are installed in radio units to transmit and receive data from the base station. A common optical transceiver used in the field is an SFP module. The SFP module, also known as small form-factor pluggable or mini GBIC (gigabit interface converter), is a compact, hot-pluggable optical transceiver module which is widely used for both telecommunication and data communications applications. Its SFP port or interface accepts both optical modules and copper cables. That's why it's developed and supported by many network component vendors.

The temperature of the device in an outdoor environment will increase due to smaller form factors and no access to forced airflow, which will increase the heat flux density of the radio unit. This results in high operating temperatures that exceed the maximum temperature limit of the optical transceiver, thus requiring an effective cooling solution.

SUMMARY

Conventional cooling solutions for the pluggable module such as an SFP module typically contain providing a heat conductor arranged between the pluggable module and a heat sink that dissipates heat through natural convection. This solution, however, has been found to have difficulty with rejecting heat into the ambient environment for radio units in 5G systems. In order to at least partially address the above and other potential problems, example embodiments of the present disclosure provide a heat dissipation component for a pluggable module and an electric device using the same.

In a first aspect, example embodiments of the present disclosure provide a heat dissipation component for a pluggable module. The heat dissipation component comprises a heat conductor attached to the pluggable module or a heat sink associated with an interface of an electrical device and is adapted to conduct heat from the pluggable module to the heat sink, the heat conductor comprising a heat input section adapted to be in thermal contact with the pluggable module: and a heat output section adapted to be in thermal contact with the heat sink: and an elastic assembly coupled to the heat conductor and adapted to, at least when the pluggable module is coupled to the interface, apply biasing forces to press the heat input section towards the pluggable module and to press the heat output section towards the heat sink.

With the heat dissipation component according to example embodiments, the heat dissipation effect of the pluggable module can be significantly improved. Furthermore, even after multiple insertions and unplugging, the heat dissipation effect will not deteriorate, thereby prolonging the maintenance period of the heat dissipation component and thus reducing the maintenance cost.

In some example embodiments, the heat dissipation component further comprises a cage coupled to at least one of the heat conductor and the elastic assembly to at least facilitate positioning of the heat conductor and the elastic assembly relative to the heat sink or the pluggable module. On the one hand, the cage can facilitate positioning of the heat conductor and the elastic assembly relative to the heat sink or the pluggable module. On the other hand, the cage can provide guidance to the pluggable module, thereby improving the reliability of the coupling of the pluggable module to the interface.

In some example embodiments, the heat conductor is Z-shaped and further comprises a transition section arranged between the heat output section and the heat input section. This arrangement can facilitate the manufacturing of the heat dissipation component.

In some example embodiments, the elastic assembly comprises a first elastic member arranged on a side of the heat input section away from the pluggable module and adapted to apply a first biasing force to press the heat input section towards the pluggable module: and a second elastic member arranged on a side of the heat output section away from the heat sink and adapted to apply a second biasing force to press the heat output section towards the heat sink.

In some example embodiments, an angle between the heat input section and the transition section is larger than or equal to 90°, and/or an angle between the heat output section and the transition section is larger than or equal to 90°. This arrangement can simplify the manufacturing and ensure the heat conductivity of the heat conductor.

In some example embodiments, the heat conductor is of a U-shape, and the elastic assembly is arranged between the heat output section and the heat input section. A variety of shapes of the heat conductor can improve the applicability of the heat dissipation component.

In some example embodiments, the U-shape of the heat conductor is formed by bending a piece of heat conductive material along a moving direction along which the pluggable module is moved to be coupled to the interface. This arrangement can simplify the structure of the elastic assembly.

In some example embodiments, the heat conductor further comprises a transition section arranged between the heat input section and the heat output section to provide a smooth transition from the heat input section to the heat output section. This arrangement can simplify the manufacturing and ensure the heat conductivity of the heat conductor.

In some example embodiments, a thermal conductivity of the heat conductor is at least 380 W/m·K. The high thermal conductivity can get better heat dissipation effect.

In some example embodiments, the heat conductor comprises at least one of a vapor chamber or a heat pipe. This arrangement can further improve the heat conductive effect from the pluggable module to the heat sink.

In some example embodiments, the elastic assembly comprises at least one reed. The reed can provide a suitable biasing force whiling improving the EMI performance of the pluggable module.

In some example embodiments, a height of the elastic assembly before deformation is configured to be larger than a distance between the heat input section and the heat sink or between the heat output section and the pluggable module. This arrangement can ensure a suitable biasing force to be applied at least when the pluggable module is inserted into the interface.

In some example embodiments, the heat conductor further comprises a coupling portion adapted to be coupled to the pluggable module or the heat sink and comprising a bent portion arranged at an end of the heat conductor to facilitate a stable fixation of the heat conductor.

In a second aspect, a method of manufacturing a heat dissipation module is provided. The method comprises providing a heat conductor attached to the pluggable module or a heat sink associated with an interface of an electrical device, the heat conductor adapted to conduct heat from the pluggable module to a heat sink, the heat conductor comprising a heat input section adapted to be in thermal contact with the pluggable module; and a heat output section adapted to be in thermal contact with the heat sink: and coupling an elastic assembly to the heat conductor, the elastic assembly adapted to, at least when the pluggable module is coupled to the interface, apply biasing forces to press the heat input section towards the pluggable module and to press the heat output section towards the heat sink.

In a third aspect, an electrical device is provided. The electrical device comprises an interface adapted to be coupled to a pluggable module; a heat sink associated with the interface; and a heat dissipation component as mentioned in the above first aspect attached to the pluggable module or the heat sink.

It is to be understood that the Summary is not intended to identify key or essential features of example embodiments of the present disclosure, nor is it intended to be used to limit the scope of the present disclosure. Other features of the present disclosure will become easily comprehensible through the description below.

BRIEF DESCRIPTION OF THE DRAWINGS

The above and other objectives, features and advantages of the present disclosure will become more apparent through more detailed depiction of example embodiments of the present disclosure in conjunction with the accompanying drawings, wherein in the example embodiments of the present disclosure, the same reference numerals usually represent the same components.

Throughout the drawings, the same or similar reference symbols are used to indicate the same or similar elements.

DETAILED DESCRIPTION

Figure 1:
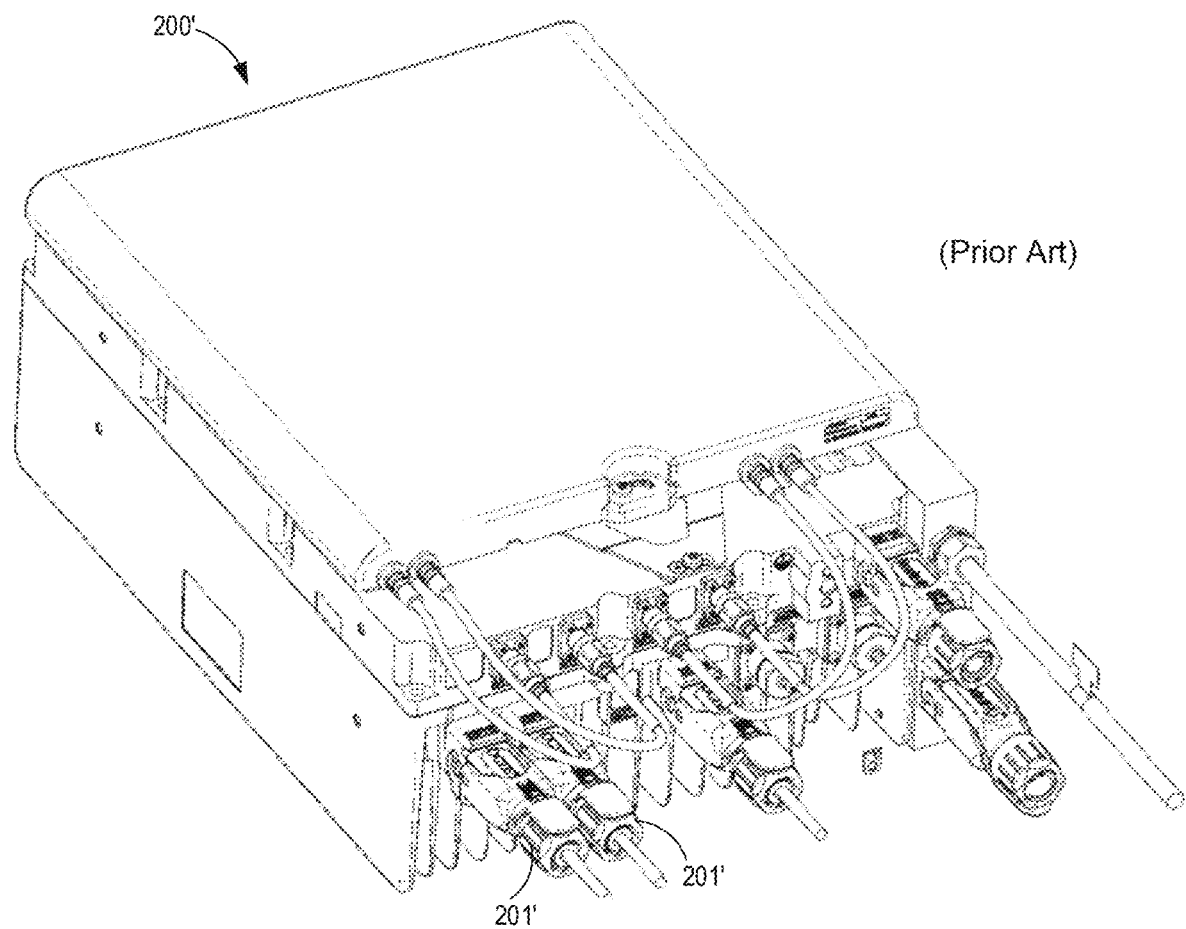
FIG. 1 shows a perspective view of an electrical device in the prior art.

The principle of the present disclosure will now be described with reference to some example embodiments. It is to be understood that these embodiments are described only for the purpose of illustration and to help those skilled in the art to understand and implement the present disclosure, without suggesting any limitation as to the scope of the disclosure. The disclosure described herein can be implemented in various manners other than the ones described below.

In the following description and claims, unless defined otherwise, all technical and scientific terms used herein have the same meaning as commonly understood by one of ordinary skill in the art to which this disclosure belongs.

References in the present disclosure to "one embodiment," "an embodiment," "an example embodiment," and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to apply such feature, structure, or characteristic in connection with other embodiments whether or not explicitly described.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the listed terms.

The terminology used herein is for the purpose of describing particular embodiments only and is not intended to limit example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

As used in this application, the term "circuitry" may refer to one or more or all of the following:
(a) hardware-only circuit implementations (such as implementations in only analog and/or digital circuitry) and
(b) combinations of hardware circuits and software, such as (as applicable):
  (i) a combination of analog and/or digital hardware circuit(s) with software/firmware and
  (ii) any portions of hardware processor(s) with software (including digital signal processor(s)), software, and memory(ies) that work together to cause an apparatus, such as a mobile phone or server, to perform various functions) and
(c) hardware circuit(s) and or processor(s), such as a microprocessor(s) or a portion of a microprocessor(s), that requires software (e.g., firmware) for operation, but the software may not be present when it is not needed for operation.

This definition of circuitry applies to all uses of this term in this application, including any claims. As a further example, as used in this application, the term circuitry also covers an implementation of only a hardware circuit or processor (or multiple processors) or portions of a hardware circuit or processor and its (or their) accompanying software and/or firmware. The term circuitry also covers, for example, and if applicable to the particular claim element, a baseband integrated circuit or processor integrated circuit for a mobile device or a similar integrated circuit in a server, a cellular network device, or other computing or network device.

As used herein, the term "communication network" refers to a network following any suitable communication standards, such as New Radio (NR), Long Term Evolution (LTE), LTE-Advanced (LTE-A), Wideband Code Division Multiple Access (WCDMA), High-Speed Packet Access (HSPA), Narrow Band Internet of Things (NB-IOT) and so on. Furthermore, the communications between a terminal device and a network device in the communication network may be performed according to any suitable generation communication protocols, including, but not limited to, the first generation (1G), the second generation (2G), 2.5G, 2.75G, the third generation (3G), the fourth generation (4G), 4.5G, the fifth generation (5G) communication protocols, and/or any other protocols either currently known or to be developed in the future. Embodiments of the present disclosure may be applied in various communication systems. Given the rapid development in communications, there will of course also be future types of communication technologies and systems with which the present disclosure may be embodied. The scope of the present disclosure should not be seen as limited to only the aforementioned system.

As used herein, the term "network device" refers to a node in a communication network via which a terminal device accesses the network and receives services therefrom. The network device may refer to a base station (BS) or an access point (AP), for example, a node B (NodeB or NB), an evolved NodeB (eNodeB or eNB), a NR NB (also referred to as a gNB), a Remote Radio Unit (RRU), a radio header (RH), a remote radio head (RRH), a relay, a low power node such as a femto, a pico, and so forth, depending on the applied terminology and technology.

The term "terminal device" refers to any end device that may be capable of wireless communication. By way of example rather than limitation, a terminal device may also be referred to as a communication device, user equipment (UE), a Subscriber Station (SS), a Portable Subscriber Station, a Mobile Station (MS), or an Access Terminal (AT). The terminal device may include, but is not limited to, a mobile phone, a cellular phone, a smart phone, voice over IP (VOIP) phones, wireless local loop phones, a tablet, a wearable terminal device, a personal digital assistant (PDA), portable computers, desktop computer, image capture terminal devices such as digital cameras, gaming terminal devices, music storage and playback appliances, vehicle-mounted wireless terminal devices, wireless endpoints, mobile stations, laptop-embedded equipment (LEE), laptop-mounted equipment (LME), USB dongles, smart devices, wireless customer-premises equipment (CPE), an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. In the following description, the terms "terminal device", "communication device", "terminal", "user equipment" and "UE" may be used interchangeably.

Figure 2:
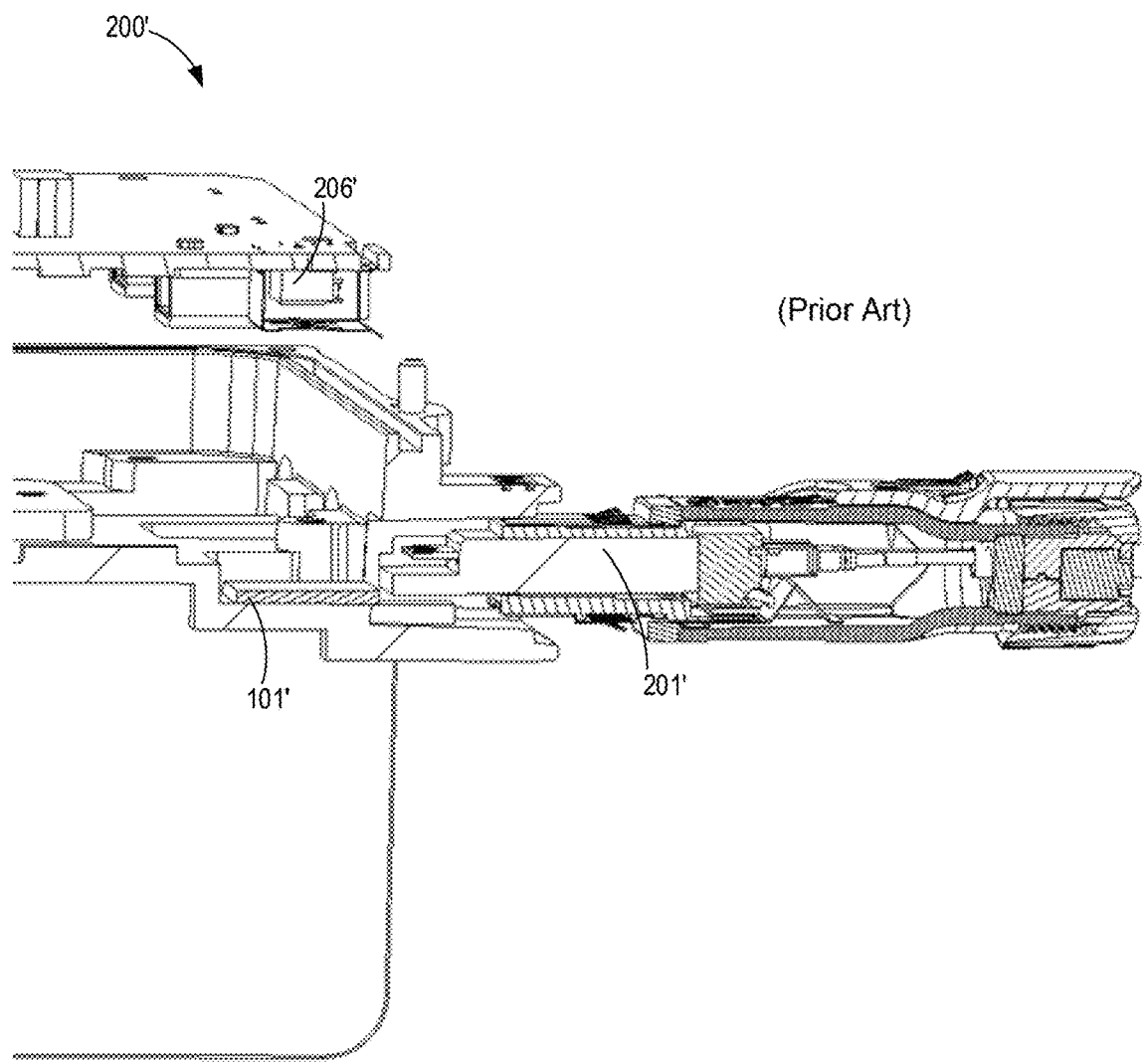
FIGS. 2 and 3 show enlarged sectional views of a pluggable module coupled to an interface without or with an adapter in conventional solutions in the prior art.

An optical transceiver 201' is a small form factor (SFP) pluggable transceiver used in telecom equipment 200', as shown in FIG. 1. The transceiver 201' which is usually coupled to an interface 206' as shown in FIG. 2, contains a laser diode that converts data into light signals and vice versa, enabling high-speed data transmission at far distances. The traditional cooling solutions for the pluggable module such as a SFP module typically contain providing a heat conductor 101', such as a thermal pad, adapted to be attached to a housing as a heat sink that dissipates heat through natural convection. In natural convection, the heat transfer occurs from thermodynamic principal of heat moving from hotter to cooler regions to find equilibrium or in this case from transceiver to heat sink to ambient air.

This solution, however, has been found to have difficulty with rejecting heat into the ambient environment for radio units in 5G systems. Furthermore, the thermal pad is typically provided with an adhesive layer on a side adjacent to the pluggable module aiming to keep good thermal contact between the thermal pad and the pluggable module. However, with the repeated plugging and unplugging of the pluggable module, the adhesive layer will be damaged and lose its function. Furthermore, on the one hand, the thermal pads have poor resilience. After multiple insertions and unplugging, it is difficult for the thermal pads to maintain effective contact with the heating surface of the pluggable module, resulting in a reduced heat transfer effect. On the other hand, the thermal conductivity of the thermal pad in the direction perpendicular to the heating surface is generally low, for example, only about 10 W/m·K at the maximum, making it difficult to dissipate the heat accumulated in the pluggable module and eventually leading to a failure of the pluggable module and even the associated telecom equipment.

Figure 3:
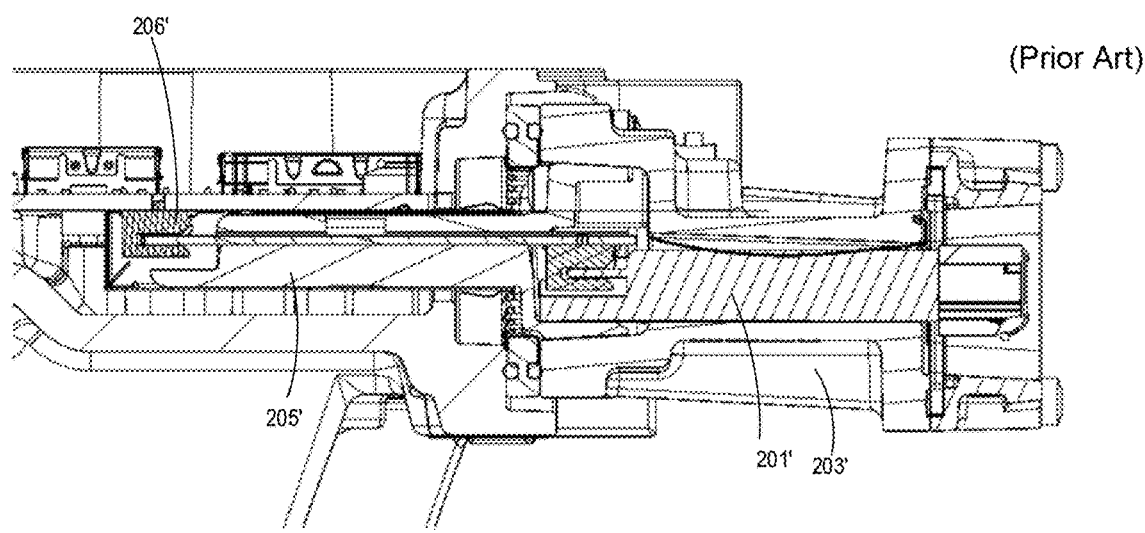

Another conventional solution aims to increase a heat dissipation surface area. Specifically, an adapter 205' is introduced to be coupled the interface 206', and thus the pluggable module can be coupled to the interface 206' via the adapter 205'. In this way, the pluggable module 201' is allowed to be located more outside relative to the telecom equipment, as shown in FIG. 3. In this way, a heat sink 203' with a larger heat dissipation surface area may be provided surrounding the pluggable device, which can improve the cooling effect to a certain degree. However, since there is no effective heat transfer medium, i.e., only air, between the pluggable module 201' and the heat sink 203', causing a thermal resistance therebetween is relatively large, so that a larger heat sink is required to achieve a predetermined heat dissipation effect.

In order to at least partially address the above and other potential problems, example embodiments of the present disclosure provide a heat dissipation component 100 for a pluggable module 201. Besides the SFP module as mentioned above, a pluggable module 201 herein means any suitable module that can be coupled to an interface of an electrical device to complete a certain function, which can also be pulled out multiple times to be decoupled from the interface e.g. during maintenance. The term "interface" herein means a component that can make electrical contact with contact fingers of the pluggable module 201 for data exchange. The interface is typically coupled to or arranged on a circuit board of an electrical device such as telecom equipment. Now some example embodiments will be described by taking the SFP module as an example of the pluggable module 201 with reference to FIGS. 4-11. Example embodiments where the heat dissipation component 100 is applied to pluggable modules 201 other than the SFP module are similar and will not be repeated in the following.

Figure 4:
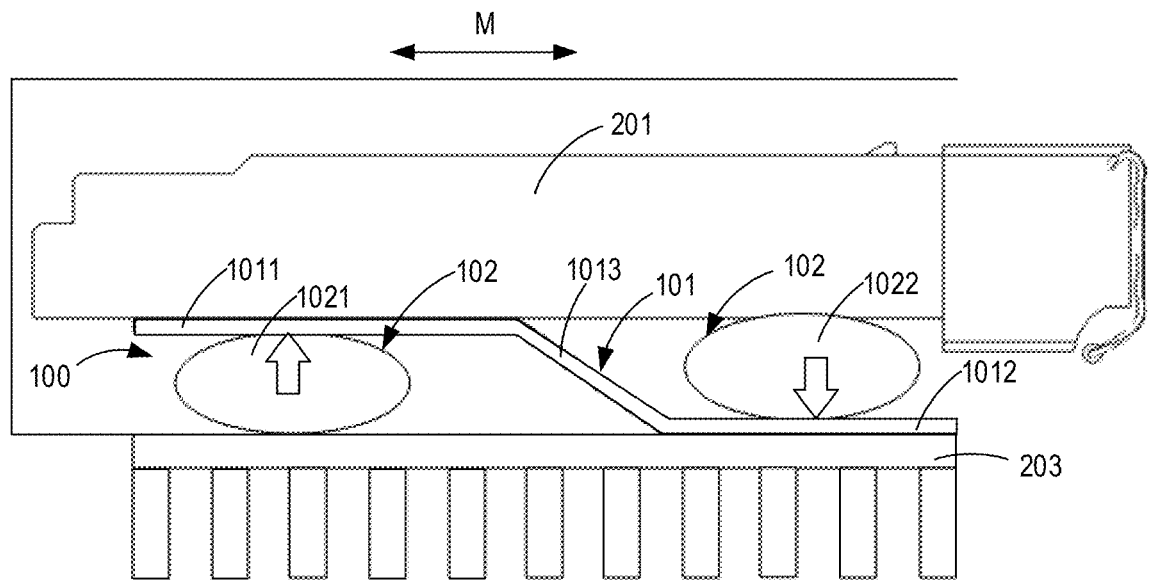
FIG. 4 shows a schematic diagram of an application environment of the heat dissipation component according to example embodiments of the present disclosure.

FIG. 4 shows a schematic diagram of an application environment of the heat dissipation component 100 according to example embodiments of the present disclosure. The application environment mainly comprises an electrical device adapted to be coupled to a pluggable component 201. For example, the electrical device may comprise an interface and a heat sink 203 associated with the interface. As mentioned above, the interface can be coupled to the pluggable component 201 to thereby perform certain functions such as enabling high-speed data transmission at far distances. The heat sink 203 herein means a passive heat exchanger that transfers the heat generated by an electronic device such as a pluggable module to the ambient environment. The heat sink 203 typically comprises a plurality of heat dissipation fins arranged on the outer circumference to enlarge the heat dissipation area. The term "associated with" herein means that the heat sink 203 is associated with the interface so that the heat sink 203 can help to dissipate the heat generated by the pluggable component 201 when the pluggable component 201 is coupled to the interface. For example, in some example embodiments, the heat sink 203 may be arranged adjacent to or at least partially surrounding the interface. The pluggable component 201 can be moved along a moving direction M to be coupled to or decoupled from the interface of the electronic device. This process is also more intuitively referred to as inserting or unplugging in the following.

Figure 5:
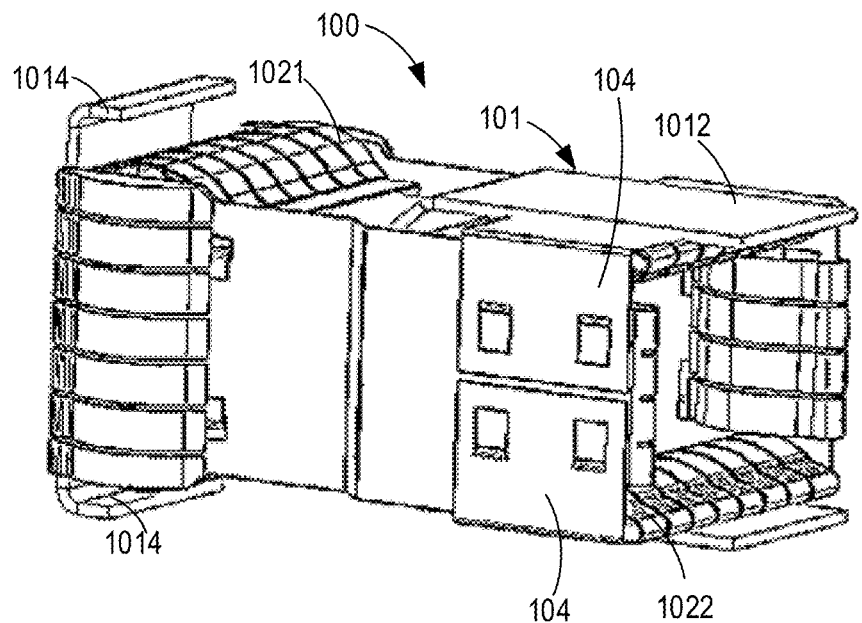
FIG. 5 shows a perspective view of a heat dissipation component according to example embodiments of the present disclosure.
Figure 6:
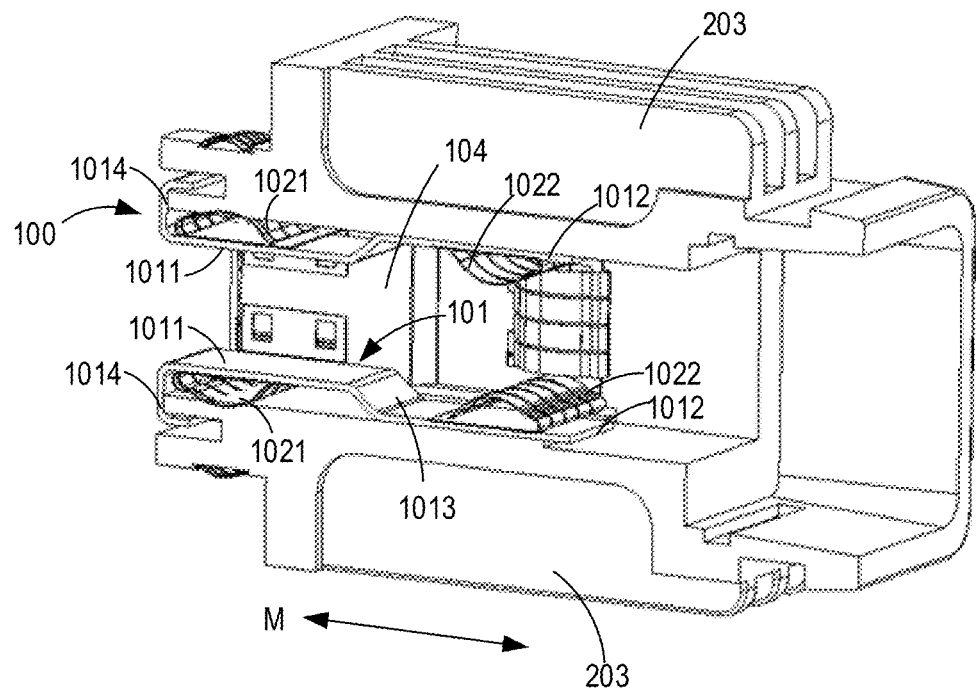
FIG. 6 shows a heat sink with a heat dissipation component according to example embodiments of the present disclosure, wherein the heat sink and the heat dissipation are cut open to show the internal structure.

As shown in FIG. 4, generally, the heat dissipation component 100 comprises a heat conductor 101 and an elastic assembly 102. The heat conductor 101 and even the whole heat dissipation component 100 can be attached to the pluggable module 201 or the heat sink 203, as shown in FIG. 5. FIG. 5 shows a perspective view of a heat dissipation component 100 according to example embodiments of the present disclosure, and FIG. 6 shows that the heat dissipation component 100 is attached to the heat sink 203. In the following, example embodiments of the present disclosure will be described mainly with the heat conductor 101 attached to the heat sink 203. It should be understood that example embodiments in which the heat conductor 101 is attached to the pluggable module 201 are similar, and will not be repeated separately in the following. The heat conductor 101 comprises a heat input section 1011 in thermal contact with the pluggable module 201 and a heat output section 1012 in thermal contact with the heat sink 203.

In some example embodiments, the heat dissipation component 100 may be attached to at least one surface of the heat sink 203 or the pluggable module 201. For example, FIG. 6 shows that the heat dissipation component 100 is attached to two opposite inner surfaces of the heat sink 203 in some example embodiments. The two surfaces as shown in FIG. 6 are typically surfaces of the pluggable module 201 where heat tends to accumulate and therefore the temperature is higher relative to other surfaces. In the following, the surfaces where heat transfer occurs are called thermal contact surfaces. For example, surfaces of the pluggable module 201, the heat conductor 101 and the heat sink 203 in thermal contact with each other are called the thermal contact surfaces in the following.

It is to be understood that the above example embodiments where the heat dissipation component 100 is arranged on two opposite inner surfaces of the heat sink 203 are merely illustrative, without suggesting any limitation as to the scope of the present disclosure. Any other suitable locations for the heat dissipation component 100 are also possible. For example, in some alternative example embodiments, the heat dissipation component 100 may also be attached to one outer surface of the heat sink 203, which will be discussed further in the following. Of course, it is to be understood that various example embodiments described herein are not exhaustive, but are intended to show that the heat dissipation component 100 can be arranged at any appropriate position as required.

Furthermore, in addition to the direct contact of two components such as the pluggable module 201 and the heat conductor 101 as mentioned above, "thermal contact" herein may also refer to cases where the two components coupled or connected to each other through any suitable means, such as thermal glue, thermal pad or the like that can efficiently conduct heat.

With the heat conductor 101, heat generated by the pluggable module 201 can be efficiently conducted to the heat sink 203 and eventually dissipated into the ambient environment in time. In some example embodiments, a thermal conductivity of the heat conductor 101 is at least 380 W/m·K, at least in a direction perpendicular to the thermal contact surface, to obtain a better heat dissipation effect. For example, in some example embodiments, the heat conductor 101 may comprise at least one of a vapor chamber or a heat pipe. Both heat pipes and vapor chambers, which have a high thermal conductivity, e.g., exceeding 3000 W/m K in some cases, utilize the same two phase cooling process. A liquid evaporates at the heat source, such as the heat input section 1011 as mentioned above, and becomes a vapor. This vapor travels through the cavity of either the heat pipe or vapor chamber to a cooler place within the pipe or chamber and condenses. By capillary action, the condensed liquid travels back to the hot spot through the wick.

Specifically, a heat pipe is very close to what it sounds like. It is a pipe used to conduct heat, of course. But the pipe has been altered to contain a wick and has been sealed to retain all the fluid installed into the pipe. While heat pipes can be made from a wide range of materials, copper and water are the favorites for metal and working fluid. Copper already has a high conductivity, commercially available, and is straightforward to manipulate during the manufacturing process. The working temperature range between freezing and evaporation for water covers most applications, so the majority of heat pipes use water within them. Vapor chambers are similar to a heat pipe since it houses vapor within a chamber, instead of a pipe, hence "vapor chamber". Vapor chambers also have a wick to transfer fluid back to heat sources. Instead of a pipe to house this vapor space and wick structure, vapor chambers typically use two plates sealed together to keep the fluid in.

In some embodiments, the vapor chamber or the heat pipe used as the heat conductor 101 may be flexible or soft. The term "flexible or soft" not only means that the shape can be changed as needed during use, but also may mean that it's shape can be changed as needed at a certain stage during the manufacturing process of the heat conductor 101 to facilitate the manufacturing thereof into a desired shape. This arrangement allows the shape of the heat conductor 101 to be easily changed or adjusted to adapt to various structures and sizes of the heat sink 203 and/or the pluggable module 201, thereby improving the applicability of the heat dissipation component 100.

It is to be understood that the above example embodiments where the heat conductor 101 comprises at least one of a vapor chamber or a heat pipe are merely illustrative, without suggesting any limitation as to the scope of the present disclosure. Any other existing and future-developed heat conductive means capable of high-efficiency heat conduction are also possible. For example, in some embodiments, the heat conductor 101 may also comprise an element made of graphite, such as an ultra-high thermal conductivity graphite sheet which has a thermal conductivity above 1000 W/m·K, etc.

In comparison with the conventional heat dissipation solutions for the pluggable module 201, the heat dissipation component 100 according to example embodiments of the present disclosure comprises the elastic assembly 102 coupled to the heat conductor 101. The elastic assembly 102, as the name suggests, has certain elastic deformation ability. At least when the pluggable module 201 is coupled to the interface, the elastic assembly 102 can be deformed thereby to apply biasing forces to press the heat input section 1011 towards the pluggable module 201 while pressing the heat output section 1012 towards the heat sink 203. Heat can be efficiently dissipated from the pluggable module 201, through the heat conductor 101 and finally to the ambient environment from the heat sink 203, as shown by the arrows in FIG. 7.

In this way, the heat conductor 101 can always maintain good thermal contact with the pluggable module 201 and the heat sink 203 at least when the pluggable module 201 is coupled to the interface, thereby significantly improving the heat dissipation effect. Furthermore, the surface of the heat conductor 101 does not require thermal conductive glue, etc., even after multiple insertions and unplugging, the heat dissipation effect will not deteriorate, thereby prolonging the maintenance period of the heat dissipation component 100, and ensuring the heat dissipation effect while reducing the cost.

In addition, the elastic assembly 102 enables the heat conductor 101 to be in good thermal contact with both of the pluggable module 201 and the heat sink 203 because both of the two contacts are crucial. In addition to ensuring the both thermal contacts of heat conductor 101 with the pluggable module 201 and the heat sink 203, the heat dissipation component 100 according to example embodiments of the present disclosure is arranged to facilitate the inserting or unplugging of pluggable modules 201 without occupying too much space.

For example, as shown in FIG. 6, the heat dissipation component 100 is arranged in the heat sink 203. Due to the good contact of the heat conductor 101 with both of the pluggable module 201 and the heat sink 203, the heat sink 203 can achieve the required heat dissipation effect with a smaller size, which ensures the heat dissipation effect while miniaturizing the heat dissipation component and even the electrical device. In some example embodiments, the heat output section 1012 and the heat input section 1011 are arranged in sequence along the moving direction M along which the pluggable module 201 is moved to be coupled to the interface. During the moving of the pluggable module 201 to be coupled to the interface, the pluggable module 201 will first pass between the heat output sections 1012 arranged on opposite inner surfaces of the heat sink 203. A large distance between the heat output sections 1012 will not hinder the moving of the pluggable module 201. In this way, the pluggable module 201 can be coupled to the interface. After the pluggable module 201 is coupled to the interface, the elastic assembly 102 will be deformed and thus to provide biasing forces to ensure the thermal contacts of the heat conductor 101 with the pluggable module 201 and the heat sink 203.

To ensure the deformation of the elastic assembly 102 when the pluggable module 201 has been coupled to the interface, a height of the elastic assembly 102 before deformation, which is measured in a direction perpendicular to the thermal contact surface as mentioned above, is selected to be larger than the distance between the heat input section 1011 and the heat sink 203 or between the heat output section 1012 and the pluggable module 201. In this way, with the moving of the pluggable module 201, the elastic assembly 102 can be deformed to provide the biasing forces.

Figure 7:
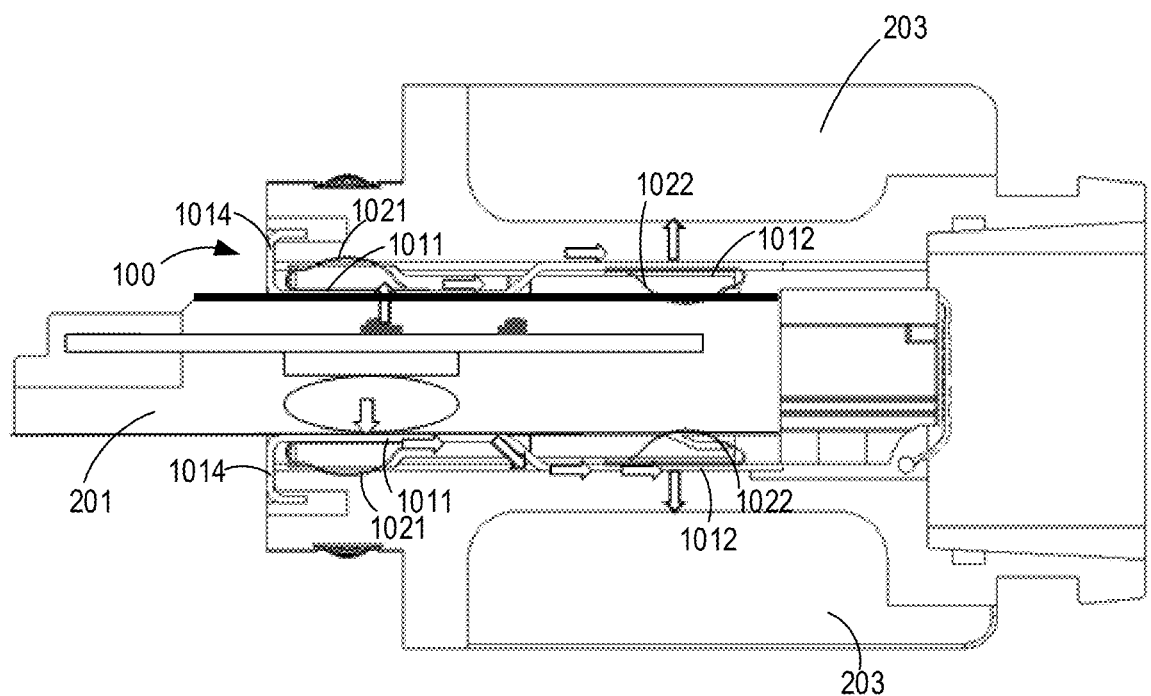
FIG. 7 shows a sectional view of a heat sink with a heat dissipation component and a pluggable module according to example embodiments of the present disclosure.

It is to be understood that the above example embodiments where the heat dissipation component 100 is arranged as shown in FIGS. 6 and 7 are merely illustrative, without suggesting any limitation as to the scope of the present disclosure. Any other suitable arrangement or structure is also possible. For example, in some alternative example embodiments, the heat input section 1011 and the heat output section 1012 may also be arranged along a direction perpendicular to the moving direction M. For example, in some example embodiments, the heat sink 203 may also be arranged at sides of the cage 104 in a direction perpendicular to the moving direction M.

Figure 9:
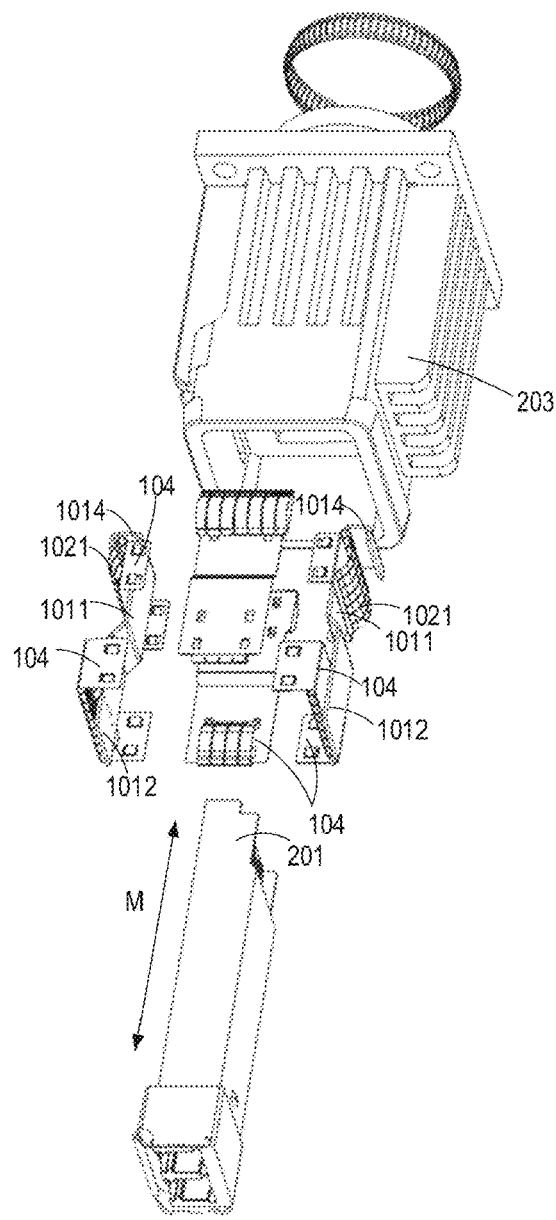
FIG. 9 shows an exploded view of a heat dissipation component and associated interface and pluggable module according to example embodiments of the present disclosure.
Figure 10:
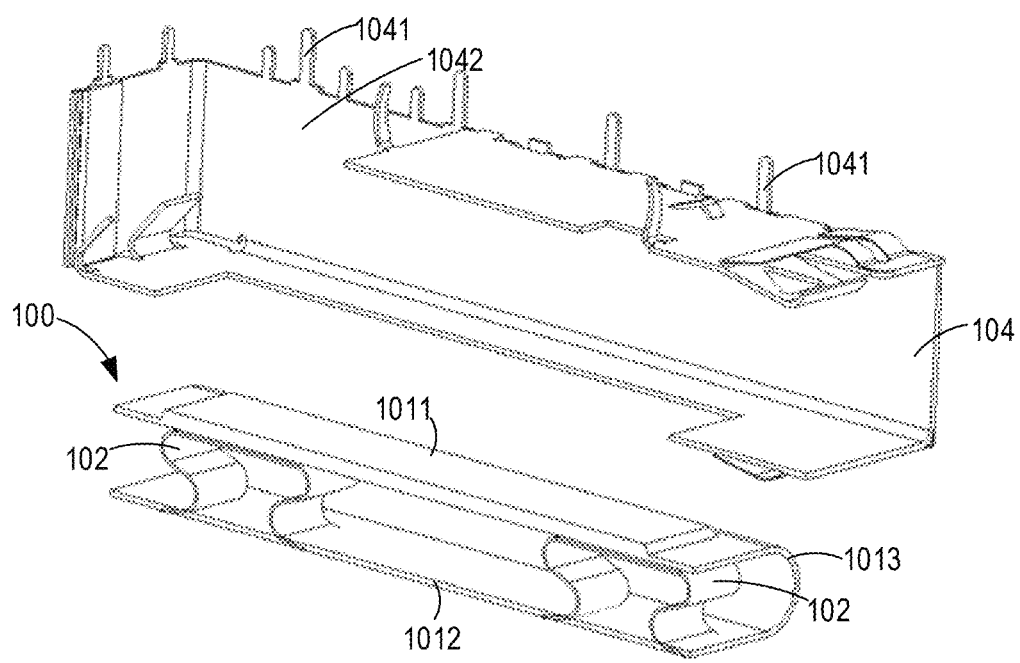
FIG. 10 shows an exploded view of a heat dissipation component according to example embodiments of the present disclosure.
Figure 11:
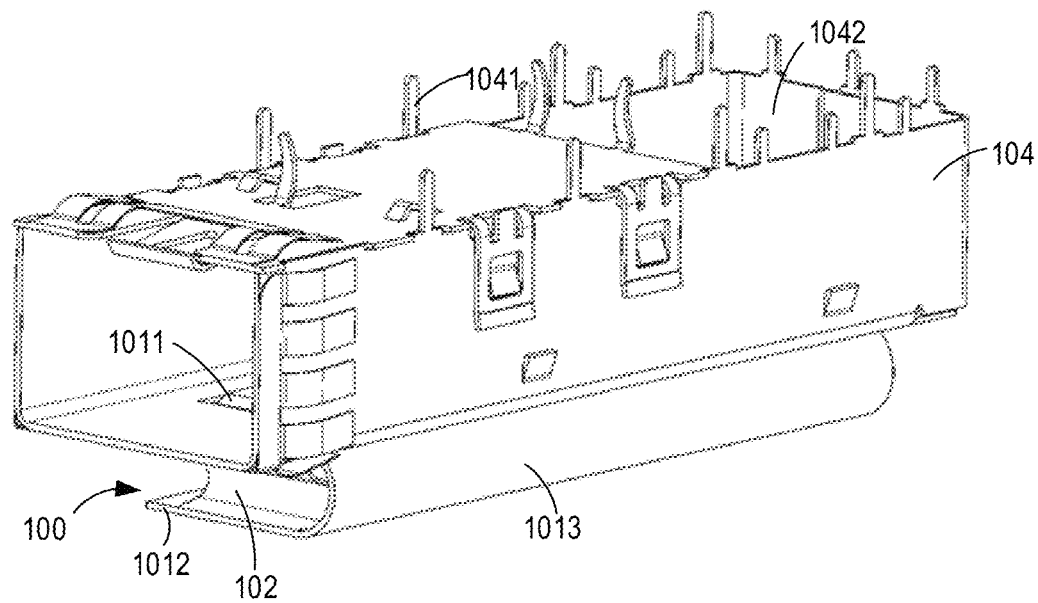
FIG. 11 shows a perspective view of a heat dissipation component according to example embodiments of the present disclosure.
Figure 12:
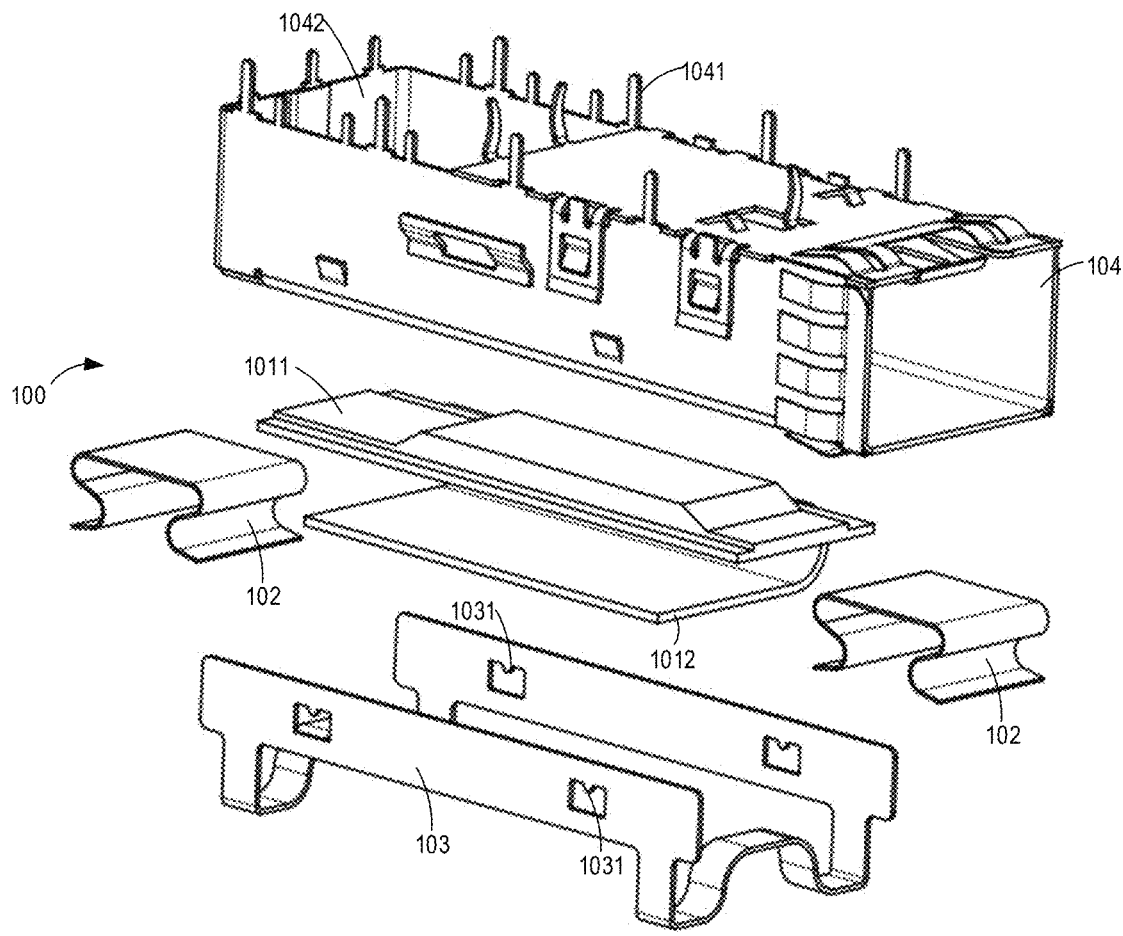
FIG. 12 shows an exploded view of a heat dissipation component according to example embodiments of the present disclosure.

Furthermore, with the heat dissipation component 100 according to example embodiments of the present disclosure, existing electrical devices such as telecom equipment either with or without an adapter via which the pluggable module 201 is coupled to the interface can be modified, thereby significantly improving the heat dissipation performance of these electronic devices in a cost-effective manner. For example, FIGS. 5-9 mainly show example embodiments where there is an adapter coupled to the interface to allow the pluggable module 201 to be located more outside of the electrical device, so that the heat sink 203 may be arranged surrounding the pluggable module 201 to obtain a better heat dissipation effect. Regarding embodiments where the pluggable module 201 is directly coupled to the interface without the adapter, which is shown in FIGS. 10-12, will be discussed further in the following.

Figure 8:
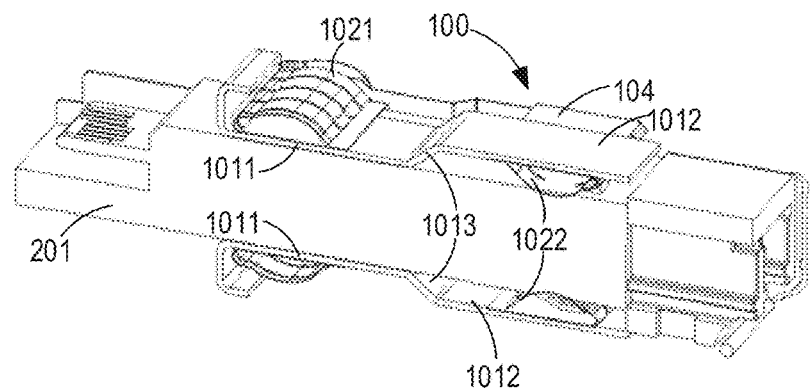
FIG. 8 shows a pluggable module with a heat dissipation component according to example embodiments of the present disclosure, wherein the pluggable module is cut along a center line.

In some example embodiments, the elastic assembly 102 may comprise at least one elastic member capable of generating the biasing force after deformation. Any suitable elastic member that can provide biasing forces after deformation is possible. For example, in some example embodiments, as shown in FIGS. 8 and 9, the elastic assembly 102 may comprise at least one reed, such as a beryllium copper (BeCu) finger-stock. The beryllium copper finger-stock is a kind of gasket having superior mechanical spring characteristics and high electrical conductivity making them ideally suited to shielding applications. Due to their high conductivity, BeCu finger-stocks provide good EMI/RFI shielding together with low closure force properties and are available in a number of plated finishes and mounting styles. With the beryllium copper finger-stock as the elastic assembly 102, reliable biasing forces can be provided while improving the EMI performance of the pluggable module 201. The beryllium copper finger-stocks may be manufactured by punching or etching thin BeCu strip which is pushed and formed into the required final shape and then heat treated to give it 'memory'.

It is to be understood that the above example embodiments where the elastic assembly 102 comprises at least one beryllium copper finger-stock are merely illustrative, without suggesting any limitation as to the scope of the present disclosure. In some example embodiments, besides the beryllium copper, the reed may also be made of any suitable other materials such as phosphorous brass, stainless steel, etc. Furthermore, the reed may also be made in any suitable shape other than the finger shape. For example, in some example embodiments, the shape of the reed may also be butterfly-shaped, disc-shaped, or the like. In addition to the elastic assembly 102 may comprise the reed, the elastic assembly 102 may also comprise an elastic silicone material or an elastic member made of any other suitable elastic material. For example, in some alternative example embodiments, the elastic assembly 102 may also comprise springs or elastic cushions, etc.

The heat conductor 101 may have any suitable shape. For example, in some example embodiments, the heat conductor 101 may be Z-shaped. In such example embodiments, the heat conductor 101 may further comprise a transition section 1013 arranged between the heat input section 1011 and the heat output section 1012 to form the Z-shaped heat conductor 101.

In some example embodiments, an angle between the heat input section 1011 and the transition section 1013 may be larger than or equal to 90°. Similarly, the angle between the heat output section 1012 and the heat sink 203 may be the same as the above angle and may be larger than or equal to 90°. For example, as shown in FIGS. 4-9, the above two angles are the same, namely, about 135°. This arrangement can further facilitate the heat conduction and simplify the manufacture of the heat conductor 101.

In example embodiments where the heat conductor 101 is Z-shaped, the elastic assembly 102 may comprise at least two members, namely, a first elastic member 1021 and a second elastic member 1022, as shown in FIGS. 4-9. The first elastic member 1021 is arranged on a side of the heat input section 1011 away from the pluggable module 201 and can apply a first biasing force to press the heat input section 1011 towards the pluggable module 201. Similarly, the second elastic member 1022 is arranged on a side of the heat output section 1012 away from the heat sink 203 and can apply a second biasing force to press the heat output section 1012 towards the heat sink 203. With the elastic assembly 102 comprising the first elastic member 1021 and the second elastic member 1022, the assembling and manufacturing of the heat dissipation component 100 can be simplified without affecting the heat dissipation effect.

Furthermore, in some example embodiments, to facilitate the attachment of the heat conductor 101 and/or the elastic assembly to the heat sink 203, the heat dissipation component may further comprise a cage 104 coupled to at least one of the heat conductor 101 and the elastic assembly 102, as shown in FIGS. 5, 6, 8 and 9. The cage 104 may have circumferential walls to at least partially receive the pluggable module 201. For example, as shown in FIGS. 5, 6, 8 and 9, in some example embodiments, the cage 104 may have two separate circumferential walls along the moving direction M. This structure of the cage 104 enables the cage 104 to adapt to the arrangement of the heat sink 203 surrounding the pluggable module 201 while ensuring the heat dissipation effect.

On the one hand, the circumferential walls of the cage 104 can facilitate positioning of the heat conductor 101 and the elastic assembly 102 relative to the heat sink 203 and the pluggable module 201, thereby ensuring the heat dissipation effect of the heat dissipation component 100. On the other hand, the cage 104 can at least partially receive the pluggable module 201 when the pluggable module 201 is coupled to the interface. As a result, during the moving of the pluggable module 201 to be coupled to the interface, the cage 104 can provide guidance to the pluggable module 201, thereby improving the reliability of the coupling of the pluggable module 201 to the interface.

It is to be understood that the above example embodiments where the cage 104 having two separated circumferential walls as shown in FIGS. 5, 6, 8 and 9 are merely illustrative, without suggesting any limitation as to the scope of the present disclosure. Any other suitable structure or arrangement of the cage 104 that can facilitate positioning of the heat conductor 101 and the elastic assembly 102 relative to the heat sink 203 or the pluggable module 201 is also possible. For example, in some example embodiments for example where the pluggable module 201 is directly coupled to the interface without the adapter, which is shown in FIGS. 10-12, the cage 104 may comprise a single-piece circumferential wall substantially along the entire length of the heat conductor 101 to close an internal space for accommodating pluggable module 201, which will be further discussed in the following.

In some example embodiments, to further facilitate a stable fixation of the heat conductor 101 to the heat sink 203 or the pluggable module 201, the heat conductor 101 may further comprise a coupling portion 1014 coupled to the heat sink 203 or the pluggable module 201. FIGS. 5 and 6 show that the coupling portion 1014 comprising a bent portion arranged at an end of the heat conductor 101 to be coupled to the heat sink 203.

It is to be understood that the above example embodiments where the coupling portion 1014 comprises the bent portion as shown in FIG. 5 are merely illustrative, without suggesting any limitation as to the scope of the present disclosure. Any other suitable structure or arrangement that can facilitate a stable fixation of the heat conductor 101 to the heat sink 203 or the pluggable module 201 is also possible. For example, in some alternative example embodiments, the heat conductor 101 may also be firmly fixed to the heat sink 203 or the pluggable module 201 by bonding, welding or riveting, etc.

As mentioned above, FIGS. 5-9 show that the heat conductor 101 may be Z-shaped to adapt to cases where there is an adapter coupled to the interface to allow the pluggable module 201 to be located more outside of the electrical device. It is to be understood that any other suitable structure or arrangement of the heat conductor 101 is also possible, e.g., depending on whether there is an adapted via which the pluggable module 201 is coupled to the interface of the electrical device. For example, in some alternative example embodiments, in the cases where the pluggable module 201 is directly coupled to the interface without an adapter, the heat conductor 101 may be of a U-shape, as shown in FIGS. 10-12.

Specifically, FIGS. 10-12 show example embodiments where the pluggable module 201 is directly coupled to the interface without an adapter. That is, the luggable module 201 and the required heat dissipation component are closer to the interface. To adapt to these example embodiments, the heat conductor 101 may be of a U-shape, which may be formed by bending the heat conductor 101 along a moving direction along which the pluggable module 201 is move to be coupled to the interface, the elastic assembly 102 may be arranged between the heat output section 1012 and the heat input section 1011. In this way, the elastic component can press the heat input section 1011 towards the pluggable module 201 and simultaneously press the heat output section 1012 towards the heat sink 203, thereby further simplifying the structure of the heat dissipation component 100.

In some example embodiments, to facilitate the arrangement of the heat dissipation component 100 relative to the interface, the cage 104 may comprise a plurality of coupling members 1041 to allow the cage 104 to be located adjacent to the interface. For example, the coupling member 1041 may be inserted into holes formed on a portion of a circuit board of the electrical device adjacent to the interface. In this way, the pluggable module 201 can be coupled to the interface by being inserted in the cage 104. Furthermore, as shown in FIGS. 10 and 11, the cage 104 may further comprise a notch 1042 formed on a wall adjacent to the circuit board to allow the interface to be arranged within the internal space formed by circumferential walls of the cage 104 when the cage 104 is fixed on the circuit board. The heat conductor 101 may be located outside of the cage 104 with the heat input section 1011 thereof passing through a wall of the cage 104, as shown in FIGS. 10 and 11. In this way, when the pluggable module 201 is inserted into the cage 104, a surface of the heat input section 1011 can be in good thermal contact with the pluggable module 201 without occupying the internal space within the cage 104.

Specifically, in some example embodiments, the heat input section 1011 may have a protrusion and the wall of the cage 104 adjacent to the heat input section 1011 may have a through slot for the protrusion of the heat input section 1011 to pass through. After passing through the wall of the cage 104, the protrusion may extend slightly beyond the inner surface of the wall to ensure the surface of the protrusion may be in thermal contact with the pluggable module 201, as shown in FIG. 11.

Furthermore, to facilitate the fixation of the heat conductor 101 and the elastic assembly 102 to the cage 104, a locking component 103 may be provided, as shown in FIG. 12. The locking component 103 may comprise a limiting portion 1031. When the locking component 103 is coupled to the cage 104 by a snap connection, as shown in FIG. 12, or by bonding, welding, a fastener connection, etc., the heat conductor 101 and the elastic assembly 102 may be arranged between the limiting portion 1031 and the housing of the cage 104. In this way, the heat dissipation component 100 can be assembled on the cage 104 easily. The limiting portion 1031 may be formed integrally with other portions of the locking component 103, for example, by stamping or punching.

It is to be understood that the above example embodiments where the heat dissipation component 100 is located outside of the cage 104 are merely illustrative, without suggesting any limitation as to the scope of the present disclosure. Any other suitable structure or arrangement is also possible. For example, in some alternative example embodiments, at least one of the heat conductor 101 and the elastic assembly 102 may also be located inside of the cage 104 with a part of the heat output section 1012 passing through a wall of the cage 104 to be in thermal contact with the heat sink 203.

In some example embodiments, the U-shape of the heat conductor 101 may be formed by bending a piece of heat conductive material such as a vapor chamber along the moving direction M along which the pluggable module 201 is moved to be coupled to or decoupled from the interface. As a result, a transition section 1013 is arranged between the heat input section 1011 and the heat output section 1012 to provide a smooth transition from the heat input section 1011 and the heat output section 1012, thereby to facilitate the manufacturing and ensure the heat dissipation performance of the heat conductor 101.

It is to be understood that the above example embodiments where the heat conductor 101 has a Z-shape or U-shape are merely illustrative, without suggesting any limitation as to the scope of the present disclosure. Any other suitable structure or arrangement is also possible. For example, in some alternative example embodiments, the U-shape of the heat conductor 101 may also be formed by bending a piece of heat conductive material along a direction perpendicular to the moving direction M as mentioned above. Similarly, in comparison with the example embodiments as shown in FIGS. 4 to 9, the Z-shape of the heat conductor 101 may also be formed by bending a piece of heat conductive material along the moving direction M. The multiple possible shapes of the heat conductor 101 make the manufacturing and assembling of the heat conductor 101 more flexible.

Figure 13:
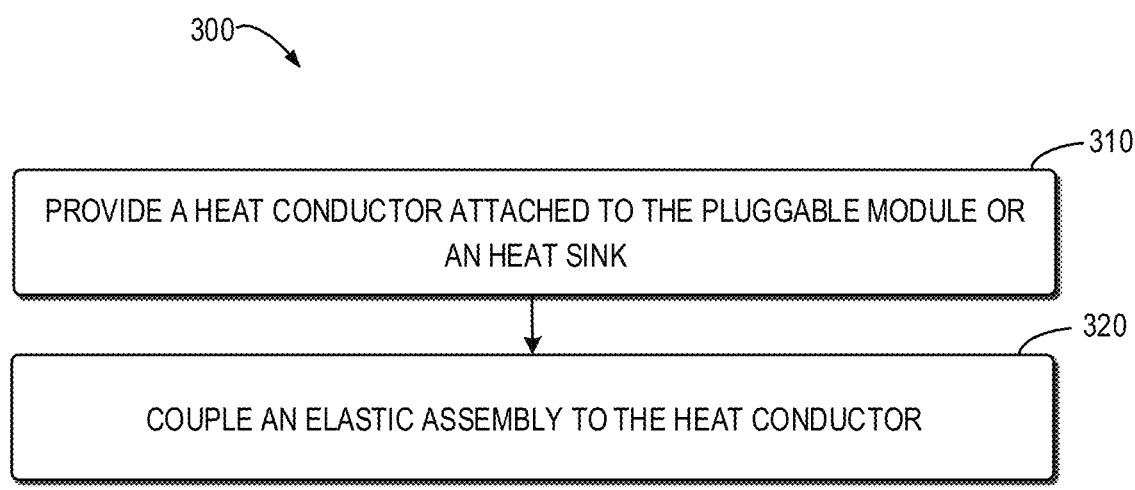
FIG. 13 shows a flowchart illustrating a method of manufacturing a heat dissipation component for a pluggable module according to example embodiments of the present disclosure.

According to other aspects of the present disclosure, a method 300 of manufacturing a heat dissipation component 100 is provided. FIG. 13 shows a flowchart illustrating a method of manufacturing a heat dissipation component 100 according to example embodiments of the present disclosure. As shown in FIG. 13, in block 310, a heat conductor 101 adapted to be attached to the pluggable module 201 or the heat sink 203 is provided. As mentioned above, the heat conductor 101 may comprise at least one of a vapor chamber or a heat pipe to obtain a better thermal conductive effect of the heat conductor 101.

In block 320, the elastic assembly 102 is coupled to the heat conductor 101. With the heat dissipation component 100 according to example embodiments, the heat dissipation effect of the pluggable module 201 can be significantly improved. Furthermore, even after multiple insertions and unplugging, the heat dissipation effect will not deteriorate, thereby prolonging the maintenance period of the heat dissipation component 100 and thus reducing the maintenance cost.

According to other aspects of the present disclosure, an electrical device such as telecom equipment is provided. The electrical device comprises an interface adapted to be coupled to a pluggable module 201 such as a SFP module or the like, a heat sink 203 associated with the interface and a heat dissipation component 100 as mentioned in the above.

With the heat dissipation according to example embodiments of the present disclosure, the heat dissipation performance of the electrical device can be significantly improved.

It should be appreciated that the above detailed example embodiments of the present disclosure are only to exemplify or explain principles of the present disclosure and not to limit the present disclosure. Therefore, any modifications, equivalent alternatives and improvement, etc. without departing from the spirit and scope of the present disclosure shall be comprised in the scope of protection of the present disclosure. Meanwhile, appended claims of the present disclosure aim to cover all the variations and modifications falling under the scope and boundary of the claims or equivalents of the scope and boundary.

What is claimed is:

1. A heat dissipation component for a pluggable module, comprising:
    a heat conductor attached to the pluggable module or a heat sink associated with an interface of an electrical device and configured to conduct heat from the pluggable module to the heat sink, the heat conductor comprising:
        a heat input section configured to be in thermal contact with the pluggable module; and
        a heat output section configured to be in thermal contact with the heat sink; and
    an elastic assembly coupled to the heat conductor and configured to, at least when the pluggable module is coupled to the interface, apply biasing forces to press the heat input section towards the pluggable module and to press the heat output section towards the heat sink.

2. The heat dissipation component of claim 1, further comprising:
    a cage coupled to at least one of the heat conductor and the elastic assembly to at least facilitate positioning of the heat conductor and the elastic assembly relative to the heat sink or the pluggable module.

3. The heat dissipation component of claim 1, wherein the heat conductor is Z-shaped and further comprises a transition section arranged between the heat output section and the heat input section.

4. The heat dissipation component of claim 3, wherein the elastic assembly comprises:
    a first elastic member arranged on a side of the heat input section away from the pluggable module and configured to apply a first biasing force to press the heat input section towards the pluggable module; and
    a second elastic member arranged on a side of the heat output section away from the heat sink and configured to apply a second biasing force to press the heat output section towards the heat sink.

5. The heat dissipation component of claim 3, wherein an angle between the heat input section and the transition section is larger than or equal to 90°, and/or
    an angle between the heat output section and the transition section is larger than or equal to 90°.

6. The heat dissipation component of claim 1, wherein the heat conductor is of a U-shape, and the elastic assembly is arranged between the heat output section and the heat input section.

7. The heat dissipation component of claim 6, wherein the U-shape of the heat conductor is formed by bending a piece of heat conductive material along a moving direction along which the pluggable module is moved to be coupled to the interface.

8. The heat dissipation component of claim 7, wherein the heat conductor further comprises a transition section arranged between the heat input section and the heat output section to provide a smooth transition from the heat input section to the heat output section.

9. The heat dissipation component of claim 1, wherein a thermal conductivity of the heat conductor is at least 380 W/m·K.

10. The heat dissipation component of claim 1, wherein the heat conductor comprises at least one of a vapor chamber or a heat pipe.

11. The heat dissipation component of claim 1, wherein the elastic assembly comprises at least one reed.

12. The heat dissipation component of claim 1, wherein a height of the elastic assembly before deformation is configured to be larger than a distance between the heat input section and the heat sink or between the heat output section and the pluggable module.

13. The heat dissipation component of claim 1, wherein the heat conductor further comprises:
    a coupling portion configured to be coupled to the pluggable module or the heat sink and comprising a bent portion arranged at an end of the heat conductor to facilitate a stable fixation of the heat conductor.

14. A method of manufacturing a heat dissipation component for a pluggable module, comprising:
    providing a heat conductor attached to the pluggable module or a heat sink associated with an interface of an electrical device, the heat conductor configured to conduct heat from the pluggable module to the heat sink, the heat conductor comprising:
        a heat input section configured to be in thermal contact with the pluggable module; and
        a heat output section configured to be in thermal contact with the heat sink; and
    coupling an elastic assembly to the heat conductor, the elastic assembly configured to, at least when the pluggable module is coupled to the interface, apply biasing forces to press the heat input section to the pluggable module and to press the heat output section to the heat sink.

15. An electrical device, comprising:
    an interface configured to be coupled to a pluggable module;
    a heat sink associated with the interface; and
    a heat dissipation component including
        a heat conductor attached to the pluggable module or the heat sink, the heat conductor including
            a heat input section configured to be in thermal contact with the pluggable module, and
            a heat output section configured to be in thermal contact with the heat sink, and
        an elastic assembly coupled to the heat conductor and configured to, at least when the pluggable module is coupled to the interface, apply biasing forces to press the heat input section towards the pluggable module and to press the heat output section towards the heat sink.

* * * * *